United States Patent [19]

Altwein

[11] 4,110,834
[45] Aug. 29, 1978

[54] METHOD AND CIRCUIT ARRANGEMENT FOR THE MULTIPLICATION OF ELECTRICAL SIGNALS

[75] Inventor: Michael Altwein, Darmstadt, Fed. Rep. of Germany

[73] Assignee: Carl Schenck AG, Darmstadt, Fed. Rep. of Germany

[21] Appl. No.: 805,850

[22] Filed: Jun. 13, 1977

[30] Foreign Application Priority Data
Jun. 19, 1976 [DE] Fed. Rep. of Germany ....... 2627586

[51] Int. Cl.$^2$ ............................................. G06G 7/16
[52] U.S. Cl. .................................... 364/841; 307/229; 328/160; 364/484; 364/575; 364/811
[58] Field of Search ........... 235/194, 186, 189, 151.31; 328/133, 160, 161, 165–167; 307/229, 230, 260; 330/10; 329/50; 324/140 R, 142, 118; 325/38 R, 41, 42, 44, 47; 364/811, 841, 484, 575

[56] References Cited
U.S. PATENT DOCUMENTS

| | | | |
|---|---|---|---|
| 2,519,223 | 8/1950 | Cheek | 235/194 |
| 2,902,218 | 9/1959 | Meyer | 235/194 |
| 3,070,309 | 12/1962 | Fluegel | 235/194 |
| 3,932,740 | 1/1976 | Mueller | 235/186 |
| 3,963,912 | 6/1976 | Brown et al. | 235/194 X |

Primary Examiner—Joseph F. Ruggiero
Attorney, Agent, or Firm—W. G. Fasse; W. W. Roberts

[57] ABSTRACT

A method for the multiplication of electrical signals comprises modulating the signals to be multiplied with functions having positive and negative values, multiplying the modulated signals together, demodulating the resulting product with demodulation functions which are the reciprocal of each modulation function, and then averaging the demodulated signal. The modulation circuit comprises an inverter, control signal gated FET's, and an operational amplifier of which the output is the desired modulated signal. A circuit comprising a shift register and an Exclusive-Or gate provides statistical alteration of the cycle duration of the modulation and demodulation functions.

19 Claims, 13 Drawing Figures

METHOD AND CIRCUIT ARRANGEMENT FOR THE MULTIPLICATION OF ELECTRICAL SIGNALS

BACKGROUND OF THE INVENTION

The invention relates to a method and apparatus for the multiplication of electrical signals. The invention is particularly useful in the analysis of vibrations and in balancing techniques. However, the invention is not limited to this field but may be used wherever signals must be multiplied.

Several methods are known in the art for multiplying electrical signals. Examples of such methods are the so-called transconductance multiplication, the Hall multiplication, the resistance modulation, the parabola (square law) multiplication, multiplication by means of a D/A converter, and the like. These methods multiply signals which are of the same or different types, such as voltages, currents, flux densities, and other signals. These known methods are based on different principles and are used for various purposes.

Multiplication of electrical signals is often employed when analyzing oscillations and when determining the unbalance of a rotating body. In each instant a single frequency component is determined from a mixture of oscillations. The oscillation mixture is present as an electrical measurement signal. The frequency component is ascertained by multiplying the measured signal such as a voltage by a sinusoidal reference oscillation. The amplitude or value of the frequency component of interest is obtained very accurately by averaging the output signal of the multiplier.

A disadvantage of the previously known methods is that an error accompanies the electrical or electronic methods which generate the product of the signals. Such an error is inherent in the product formation of the signals to be multiplied. In describing an electronic multiplier one starts with two input values $X(t)$ and $Y(t)$ and an output value $A(t)$. For an ideal electronic multiplier, the following is true:

$$A(t) = X(t) \cdot Y(t)$$

However, errors accompany the execution or technological realization of such a multiplier. The errors involved are particularly the zero point errors $X_{os}$ and $Y_{os}$ of the two inputs X and Y, respectively, the zero point error $A_{os}$ of the output A, as well as the errors caused by nonlinearities of the multiplier. These errors are disturbingly conspicuous in the multiplication arrangements of the prior art.

OBJECTS OF THE INVENTION

In view of the foregoing, it is the aim of the invention to achieve the following objects, singly or in combination:

to provide a multiplication method for electrical signals which is particularly suitable for use in vibrational analysis and balancing techniques;

to provide a multiplication arrangement which avoids zero point errors of each input and eliminates the zero point error of the output;

to provide a multiplication arrangement in which the errors due to nonlinear operations are reduced or suppressed, including those due to circuit nonlinearities, especially those nonlinearities which are of an "even" order;

to provide a circuit arrangement which performs the multiplication of electrical signals according to the method of the invention;

to provide a simple demodulation system for carrying out the present method;

to provide easy and accurate switching circuit means which realize the modulation functions used in the present method; and to provide a modulation circuit suitable for carrying out the method of the invention;

SUMMARY OF THE INVENTION

According to the invention, a method is provided for the multiplication of electrical signals, in which the zero point errors of the input signals and the zero point error of the output signal are eliminated. A circuit arrangement for carrying out this method is also provided.

The signals to be multiplied are first modulated with a modulation function which has positive and negative values. This modulation occurs before the specified multiplication of the signals. The signal resulting from multiplication is then demodulated using the reciprocal function of each modulation function. The demodulated signal is then averaged.

The zero point errors of the inputs and the zero point error of the output are eliminated for all practical purposes by using this method of multiplication. This method also reduces or suppresses errors due to nonlinearities. In particular, errors due to nonlinearities involving even orders or powers are reduced or suppressed. The specified modulation and the demodulation may be carried out comparatively easily by electrical means. Therefore, the proposed method yields a progressive improvement over prior art methods.

Rectangular functions having different frequencies or rectangular functions having the same frequency, but out of phase by $N\pi/2$, where N is an odd integer, and preferably by $\pi/2$ or $3\pi/2$, are used as modulation and demodulation functions. Rectangular functions which are simple switching functions with values of $\pm 1$ are particularly preferred. These switching functions may be physically realized very simply and very accurately.

The demodulation functions may be combined into one function which represents the product of the individual demodulation functions. Such a demodulation function leads to simplification of the steps in the method of the invention. When multiplying a.c. signals, the modulation or demodulation frequencies should extend in a sufficiently wide range beyond the frequencies of the electrical signals to be multiplied. After demodulation, the signal is filtered through a low pass filter. In any case, the cycle duration of the modulation and demodulation functions may be altered statistically. It is thus possible to suppress undesired interfering frequencies (harmonics), for example, in frequency analysis.

Only one of the input signals need be modulated in certain applications. THe product signal generated by the multiplication arrangement is then demodulated with the reciprocal function of the modulation function. This output signal is then averaged, or smoothed.

A circuit arrangement which carries out the method of the invention comprises at least one modulation device, a multiplication device, a number of demodulation devices which corresponds to the number of modulation devices, and an averaging circuit. The modulation device(s) are connected to the input(s) of the multiplication device. The output signal of the multiplication arrangement is applied to a cascaded arrangement of demodulation circuits. However, the demodulation devices may be combined into one demodulator.

The actual circuit for a demodulator may be very simple, depending on the choice of modulation functions. Switching circuits are advantageously used in the modulator and demodulator devices. Thus, a particularly simple and accurate technological circuit realization of the invention is obtained by using electronic switching means.

A shift register may be used to suppress the interfering components of the signals to be multiplied in, for example, vibrational analysis. The shift register circuit alters statistically the modulation and demodulation functions.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS

Figure 1:
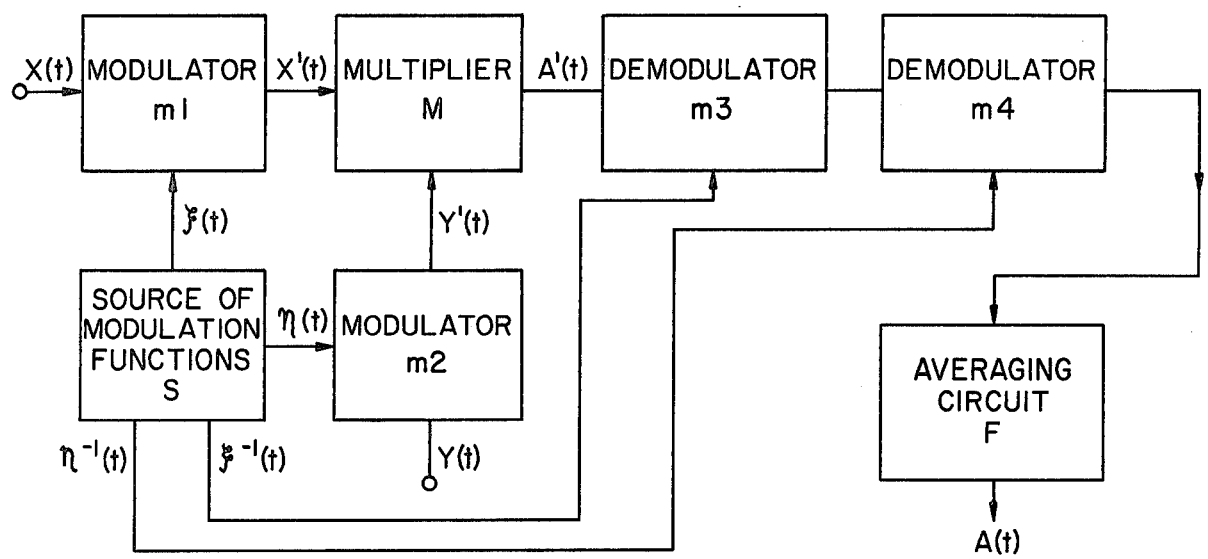
FIG. 1 is a block diagram of a circuit arrangement for the multiplication of two electrical signals according to the invention.

FIG. 1 shows the application of electrical signals $X(t)$ and $Y(t)$ to the modulation device m1 and m2, respectively, according to the invention. The signals $X(t)$ and $Y(t)$, which are to be multiplied, may be, by way of example, a measured signal and a reference signal which has the same frequency, to determine an unbalance oscillation in a balancing machine. The electrical signals, $X(t)$ and $Y(t)$ are modulated with the modulation functions $\xi(t)$ and $\eta(t)$, respectively, from source of modulation functions S, in the modulation devices m1 and m2.

Switching functions derived in accordance with the present state of technology may be used as the modulation functions. These functions modulate the signals $X(t)$ or $Y(t)$ by multiplying with the values +1 or −1, or other arbitrary positive and negative values, during appropriate successive time intervals. The input signals $X(t)$ and $Y(t)$ after being modulated, are labeled $X'(t)$ and $Y'(t)$, as shown in FIG. 1.

Any other suitable modulation function may be used instead of the described switching functions. Such a modulation function must have positive and negative values during one period so that it can be represented by a defined reciprocal function. The reference level of the modulation function is, in the usual manner, the zero point common to all the signals.

The cycle duration of the modulation functions is generally short compared to the cycle duration of the signals being processed. The desired error suppression is achieved by appropriately choosing the cycle duration of the modulation functions in conjunction with the final averaging process.

Figure 4:
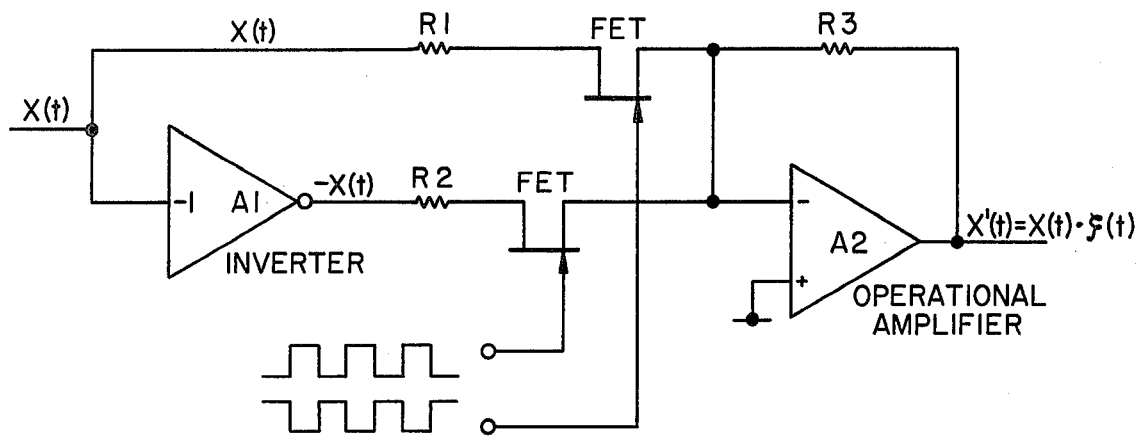
FIG. 4 is a circuit diagram of a modulation device m which may be employed in the circuit of FIG. 1.

FIG. 4 shows a modulation device, or an electronic switching device, which may be used as m1 or m2. The modulation device m comprises an inverting amplifier A1 having a gain of −1, three resistors R1, R2, and R3, two field effect transistors or FET's, and an operational amplifier A2. The inverting amplifier A1 multiplies the input amplitude, e.g. $X(t)$, by −1. Rectangular wave control voltages are applied to the gate inputs of the FET's. The outputs of the FET's are connected to form a summing point. This summing point output is applied to the inverting input of the operational amplifier A2. The output of the inverter circuit comprised of amplifier A2 and resistor R3 is the modulated input signal, e.g. $X'(t) = X(t) \cdot \xi(t)$. Any other suitable modulation or switching device may be used in place of the modulation device m of FIG. 4. Such devices are well known in the art.

The multiplication device M of FIG. 1 multiplies the signals $X'(t)$ and $Y'(t)$. The device M may be any multiplier device known in the art.* The generated product is labeled $A'(t)$ in FIG. 1.

* e.g. type AD530 from Analog Devices, Inc.

The product $A'(t)$ has the input errors $X_{os}$ and $Y_{os}$ and output offset error $A_{os}$ as well as the linearity errors of the multiplication device M.

The output signal $A'(t)$ is then demodulated by the demodulation devices m3 and m4, as shown in FIG. 1. The demodulation devices m3 and m4 use the reciprocals $\xi^{-1}(t)$ and $\eta^{-1}(t)$ of the modulation functions $\xi(t)$ and $\eta(t)$, respectively, as the demodulation functions. This demodulation, cancels the effect of the modulation in the modulators m1 and m2. Thus, for example, this demodulation would not modify the output of multiplication device M in any way, if device M were an ideal multiplier.

A suitable averaging device F smooths out the signal resulting from the demodulation of $A'(t)$. This averaging device may be, by way of example, a low pass filter known in the art, a slowly (lagging) moving coil instrument, or another device, depending on the kind of signal which is to be averaged. The output of the averaging device is labeled $A(t)$ in FIG. 1.

The desired product $A(t)$ is the result of the above described modulation, multiplication, demodulation, and averaging. The product $A(t)$ is free of input and output errors. In the given case $A(t)$ is free of linearity errors of the multiplication device M. According to the invention, the output error $A_{os}$, as a static error component, is only modified by the demodulation functions. The demodulation of the invention transforms this output error component. This operation shifts the error component into an appropriately high band of frequencies. Therefore, filtering or averaging eliminates this error component from $A(t)$.

Other low frequency error components are suppressed in the same way. The output errors arising from nonlinearities involving even powers, particularly quadratic errors, are eliminated in an analogous manner. These errors also generate a static component at the output of the multiplication device M. This static component is then suppressed in the above-described way. The zero point errors of the inputs are eliminated by demodulating each error respectively with the reciprocal modulation function of the other input. Then after being averaged, these input errors will no longer be present in the output signal.

It is possible for the undesired zero point error to appear at only one input of the multiplication device M. In this case, the use of one modulation function and one corresponding demodulation function is sufficient to achieve suppression of the zero point error. The suppression of the remaining errors is practically not affected.

The development of the signals as shown in FIGS. 2 and 3 graphically illustrates, how the error suppression is accomplished, using the output error $A_{os}$ as an example. Similar signal patterns are generated in suppressing input errors and errors due to nonlinearities.

The demodulation functions can be combined so that only one demodulation device is necessary. Such a demodulation device must merely generate the product function of the two demodulation functions. FIG. 3e shows, for example, how a simple product function results from using two modulation functions which have different frequencies.

FIG. 2 shows the development of the signals $X'$ and $Y'$ as a function of time when applied to the circuit arrangement of FIG. 1. $X(t)$ and $Y(t)$ are rectangular pulse signals having different amplitudes during different time intervals. The pulses in $X(t)$ and $Y(t)$ occur at different times.

Figure 2A:
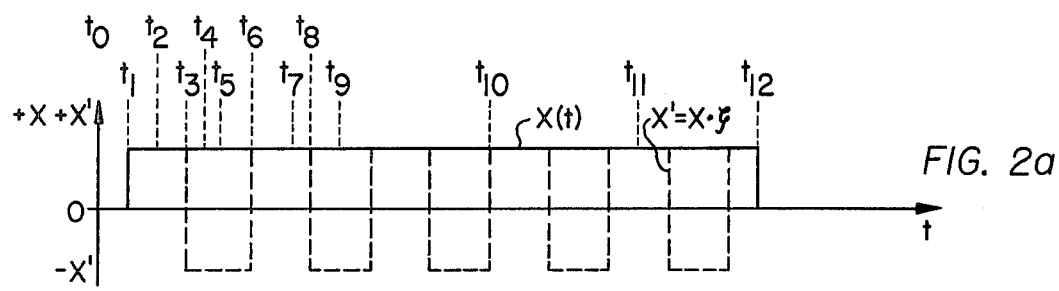
FIG. 2a shows a rectangular pulse $X(t)$ with the modulated signal $X'(t) = X(t) \cdot \xi(t)$ indicated by a dotted line.

The input voltage $X(t)$ is indicated by a solid line in FIG. 2a. The input voltage $Y(t)$ is indicated by a solid line in FIG. 2b. The multiplication of the two voltages $X(t)$ and $Y(t)$ results in the signal shown in FIG. 2c for the ideal case.

Figure 2B:
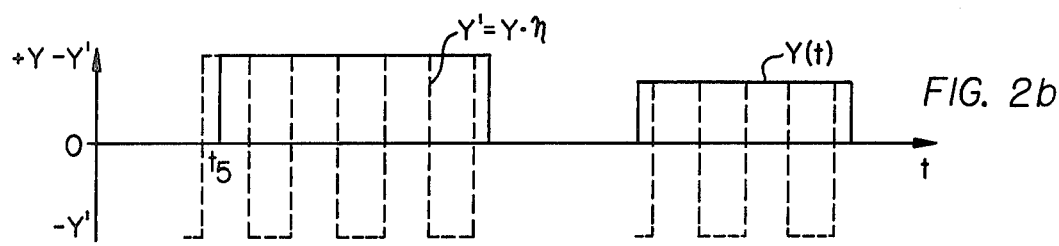
FIG. 2b shows a signal $Y(t)$ comprising two rectangular pulses with different amplitudes, with the modulated signal $Y'(t) = Y(t) \cdot \eta(t)$ indicated by a dotted line.
Figure 2C:
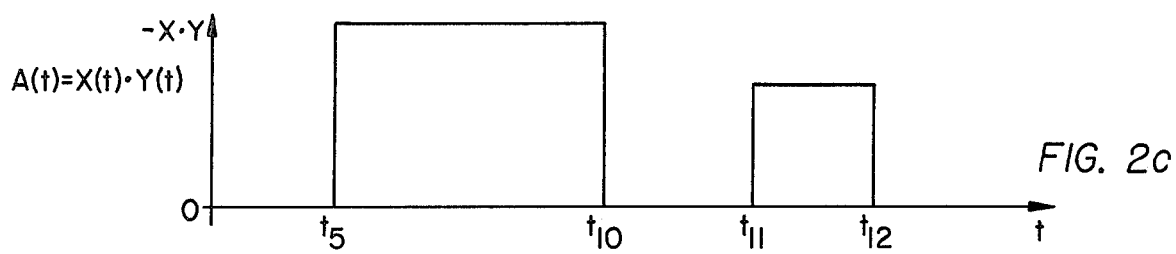
FIG. 2c shows the output $A(t) = X(t) \cdot Y(t)$ of an ideal multiplier having the inputs $X(t)$ of FIG. 2a and $Y(t)$ of FIG. 2b.

In FIG. 2a, the modulated input voltage $X'(t) = X(t) \cdot \xi(t)$ is indicated by a dotted line. In FIG. 2b, the modulated input voltage $Y'(t) = Y(t) \cdot \eta(t)$ is indicated by a dotted line. In each case, the modulation function $\xi(t)$ or $\eta(t)$ is a simple switching function alternating between the values $\pm 1$, i.e., having equal positive and negative levels. In the given example, the modulation functions $\xi(t)$ and $\eta(t)$ are rectangular functions which have different frequencies. Rectangular functions having the same frequency can also be used. In the latter case, the phase shift between the modulation functions must be $\pi/2$ or $3\pi/2$.

Figure 2D:
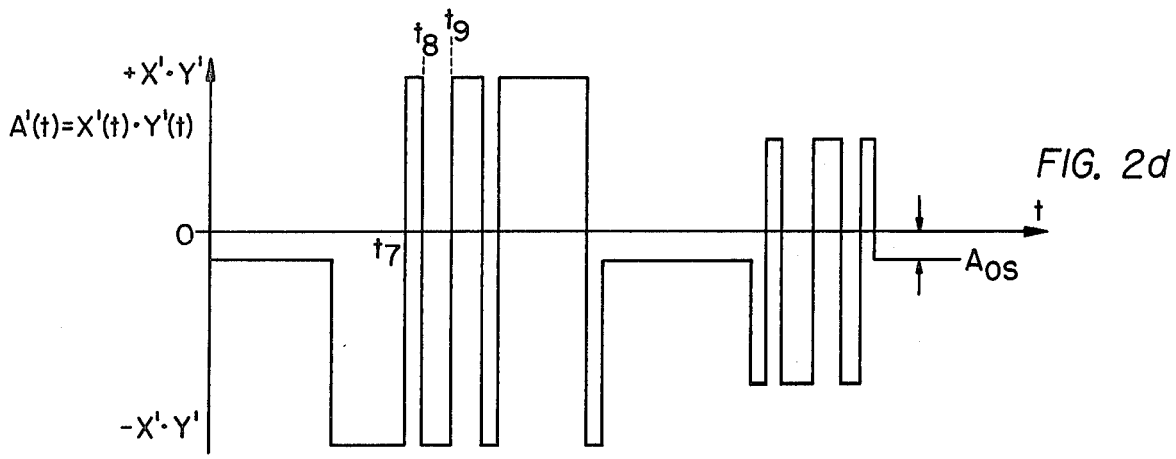
FIG. 2d shows the output $A'(t)$ of the multiplication arrangement M of FIG. 1 with the inputs $X'(t)$ of FIG. 2a and $Y'(t)$ of FIG. 2b.

FIG. 2d shows the signal pattern generated by the multiplication of the two modulated signals $X'(t)$ and $Y'(t)$. According to FIG. 2d it is seen that the multiplication device M causes a constant output error $A_{os}$. The amplitude of the output signal $A'(t) = X'(t) \cdot Y'(t)$ is either increased or decreased by the error $A_{os}$. The output error $A_{os}$ is assumed negative in the example shown. Thus, positive output voltages are decreased by the output error, whereas negative output voltages are correspondingly larger.

At the time $t_0$ only the negative output error $A_{os}$ is present at the output of the multiplication device M. This voltage level remains until the instant of time $t_5$. At the time $t_5$ formation of the product begins. During $t_5$ the modulated input signal $X'(t)$ has a negative value and the modulated input signal $Y'(t)$ has a positive value. Therefore, the product $X'(t) \cdot Y'(t)$ of the two signals is negative. The negative value of the product is added to the output error $A_{os}$ which has been assumed negative. At the time $t_6$, the input signals change their signs simultaneously. Therefore, the multiplication product stays negative.

At the time $t_7$ the input signal $Y'(t)$ once again changes its sign. Since both input signals are now positive, the product of the two signals becomes positive. The product is, however, decreased by the negative output error $A_{os}$ of the multiplication device M. At the time $t_8$, the input signal $X'(t)$ again becomes negative. The input signal $Y'(t)$ stays positive until the time $t_9$. Therefore, the product $X'(t) \cdot Y'(t)$ again becomes negative between the times $t_8$ and $t_9$. At the time $t_9$ both input signals are again negative so that the product becomes positive, etc.

At the time $t_{10}$, the input signal $Y'(t)$ becomes zero. Therefore, the product $X'(t) \cdot Y'(t)$ of the two input signals likewise equals zero between $t_{10}$ and $t_{11}$. Only the output error $A_{os}$ is present at the output of the multiplication device M, as seen in FIG. 2d. At the time $t_{11}$, product formation starts once again.

Figure 2E:
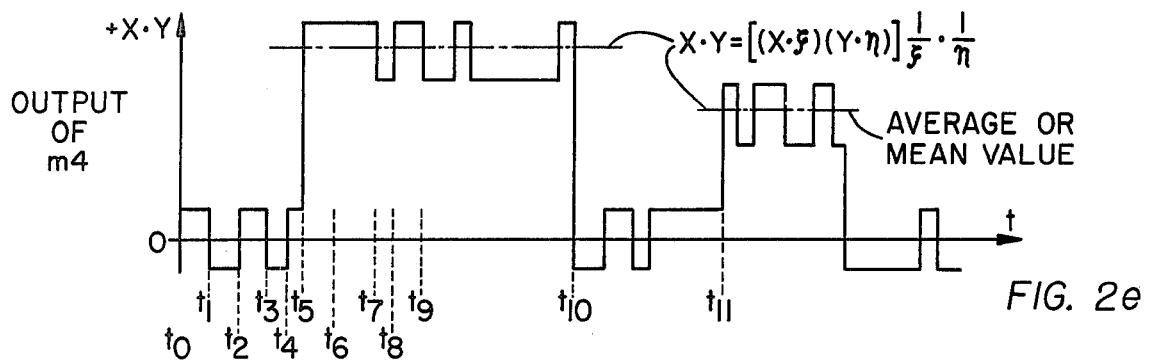
FIG. 2e shows the signal $A'(t)$ of FIG. 2d after demodulation, with the average value of the demodulated signal indicated by a dash-dotted line.

FIG. 2e shows the signal pattern generated by demodulating the product $X'(t) \cdot Y'(t)$ of the modulated input voltages of FIG. 2d. The product $X'(t) \cdot Y'(t)$ is multiplied with the reciprocal values $1/\xi$ and $1/\eta$ of the modulation functions in synchronization with the modulation frequencies. This operation is explained below.

Only the output error $A_{os}$ is present at the output of the multiplication device M, as shown in FIG. 2d. This error will also be demodulated in synchronization with both demodulation frequencies.

The time sequency of the modulation signals may be ascertained from the modulated (dotted line) signals of FIGS. 2a and 2b. At the time $t_1$ the output error $A_{os}$ is multiplied by $1/\xi = 1/+1$ and by $1/\eta = 1/+1$, i.e., it is multiplied by $+1$. The assumed negative value of the output error $A_{os}$ stays negative between $t_1$ and $t_2$. At the time $t_2$ the modulation function $\eta(t)$ changes its sign. Therefore, at $t_2$, the demodulation function $\eta-1(t)$ also changes its sign. Thus, the negative voltage value $A_{os}$ existing at the output of the multiplication device M is multiplied by: $1/\xi = 1/+1 = 1$ and by $1/\eta = 1/-1$, i.e., by $-1$. A positive output value is generated because the $A_{os}$ to be demodulated is a negative voltage itself, as shown in FIG. 2e. The amplitude of the positive output value equals the absolute value of the output error $A_{os}$. At the time $t_3$ the value of the output error changes, again becoming negative, etc.

At the time $t_5$ the multiplication device M has a negative output voltage, as shown in FIG. 2d. The signs of the demodulation functions are as follows: $1/\xi = 1/-1$ $= -1$ and $1/\eta = 1/+1 = +1$. From this one obtains: $1/\xi \cdot 1/\eta = -1$.

Therefore, the negative output voltages of the multiplication device M, which includes the output error $A_{os}$, is multiplied by $-1$. Thus, as shown in FIG. 2e, after demodulation, the output will have a positive voltage value from the time $t_5$ to the time $t_6$. The positive voltage value equals the absolute value of the negative voltage value of FIG. 2d including the output error, during the stated time interval.

At the time $t_6$ the signs of both modulation functions change. Therefore, the demodulated positive output voltage remains at the same level until the time $t_7$. The modulation functions, and hence the demodulation functions, have positive values between $t_7$ and $t_8$. Therefore, the voltage value existing between $t_7$ and $t_8$ in FIG. 2d remains the same value in FIG. 2e. This value is reduced from the theoretically correct product (FIG. 2c) of the two output voltages by the output error $A_{os}$. Thus, only the lower voltage value is present after demodulation. Therefore, as shown in FIG. 2e, the resulting signal is lowered from its preceding level (just prior to $t_7$) by an amount equal to twice the absolute value of the error $A_{os}$.

The modulation and demodulation functions again have different signs between $t_8$ and $t_9$. Thus, the negative voltage which exists between $t_8$ and $t_9$ in FIG. 2d is again multiplied by $-1$ and becomes positive. The rest of the signal pattern of FIG. 2e is generated in the same way.

The voltage values of FIG. 2e will be averaged, or smoothed, according to the invention. The resulting average value corresponds to the exact product of the two input values $X(t)$ and $Y(t)$. The dash-dotted line in FIG. 2e indicates the average value of the shown product. According to the signal pattern of FIG. 2e, it may be seen that the output error $A_{os}$ of the multiplication device M will also be eliminated when no product formation occurs.

In FIG. 3, the method of the invention is used for the multiplication of a.c. or alternating voltages. FIG. 3 shows the signal development when the method is applied to two voltages which have the same frequency.

The two voltages have been assumed to be in phase to simplify the representation and appearance of the signal patterns. However, any phase relation whatsoever may exist between alternating voltages to be multiplied. The multiplication of two alternating voltages having the same frequency arises, for example, in vibrational analysis and in balancing techniques.

Figure 3A:
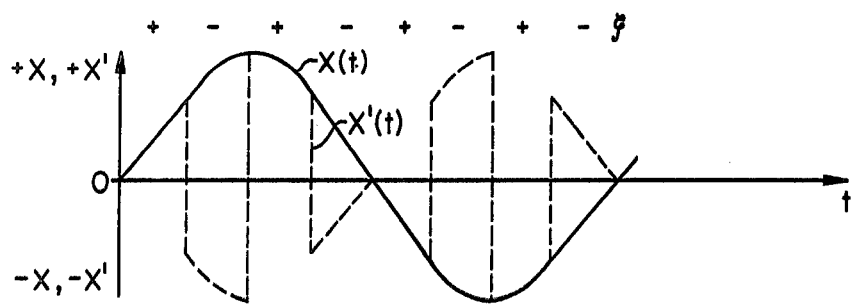
FIG. 3a shows an alternating voltage $X(t)$, with the modulated signal $X'(t) = X(t) \cdot \xi(t)$ indicated by a dotted line.
Figure 3B:
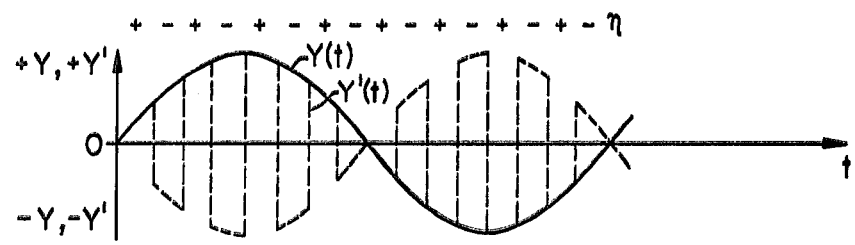
FIG. 3b shows an alternating voltage $Y(t)$ having a maximum amplitude different from that of $X(t)$ of FIG. 3a, but having the same frequency, with the modulated signal $Y'(t) = Y(t) \cdot \eta(t)$ indicated by a dotted line.

FIGS. 3a and 3b show the input voltages $X(t)$ and $Y(t)$, respectively. The maximum amplitudes of $X(t)$ and $Y(t)$ are different. The dotted lines in FIGS. 3a and 3b represent the modulated input voltages $X'(t)$ and $Y'(t)$, respectively. Switching functions with values of $\pm 1$ are also used in this case as the modulation functions $\xi(t)$ and $\eta(t)$. For each switching step, the signs of the modulation functions $\xi(t)$ and $\eta(t)$ are shown directly over the wave forms of FIGS. 3a and 3b, respectively.

Figure 3C:
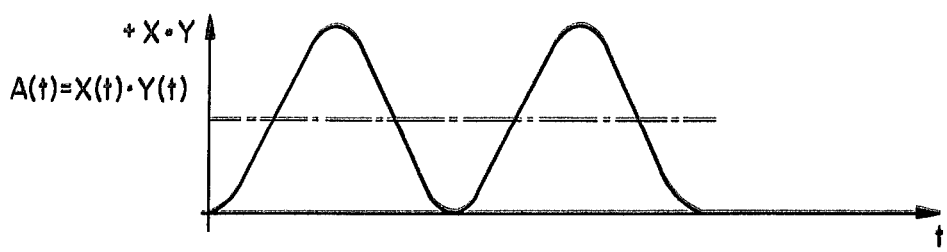
FIG. 3c shows the output $A(t) = X(t) \cdot Y(t)$ of an ideal multiplier having the inputs $X(t)$ of FIG. 3a and $Y(t)$ of FIG. 3b.
Figure 3D:
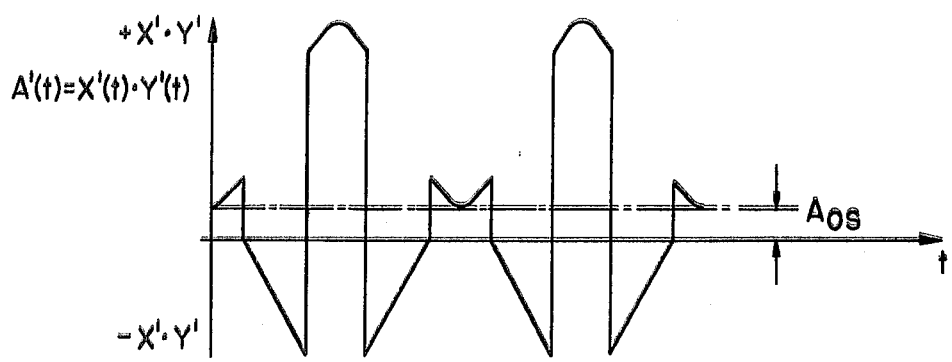
FIG. 3d shows the output $A'(t)$ of the multiplication arrangement M of FIG. 1 with the inputs $X'(t)$ of FIG. 3a and $Y'(t)$ of FIG. 3b.
Figure 3E:
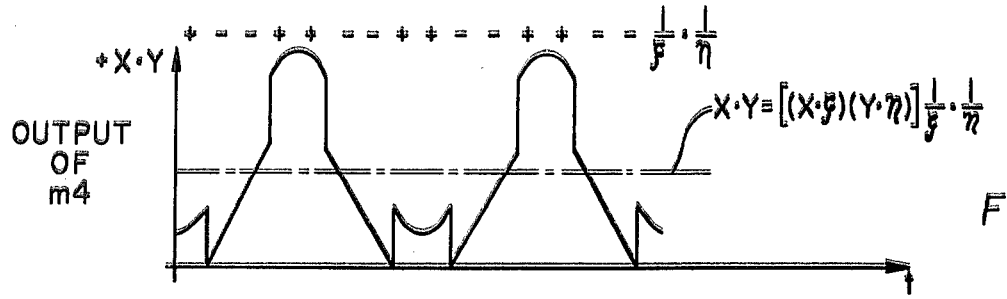
FIG. 3e shows the signal $A'(t)$ of FIG. 3d after demodulation, with the average value of the demodulated signal indicated by a dash-dotted line.

The ideal product curve is given in FIG. 3c. FIG. 3d is a curve of $X'(t) \cdot Y'(t)$, i.e., the curve resulting from the multiplication of the modulated input signals $X'(t)$ and $Y'(t)$. The output error $A_{os}$ has been assumed positive in this case. FIG. 3e shows the signal pattern generated after the signal of FIG. 3d is demodulated with $\xi^{-1}(t)$ and $\eta^{-1}(t)$. The signal patterns of FIGS. 3d and 3e are generated in the same way as already described for the signal patterns of FIGS. 2d and 2e. The curved sections of these signal patterns between the inversions caused by the modulation functions correspond to the curved sections of the ideal product curve of FIG. 3c.

The sign of the demodulation function $1/\xi \cdot 1/\eta$ is given directly over the signal pattern of FIG. 3e for each demodulation time interval. Only a simple demodulation arrangement is required for the modulation functions which have been chosen. In the given example, the $\pi/2$ phase shifted modulation function $\xi(t)$ is sufficient for demodulating the output signal of the multiplication device M. A second demodulation device is not necessary.

The average value of the product $X(t) \cdot Y(t)$ is indicated by the dash-dotted lines in FIGS. 3c and 3e. The average value according to FIG. 3e will assume the theoretical curve shown in FIG. 3c at a sufficiently low frequency of the theoretical product.

Figure 5:
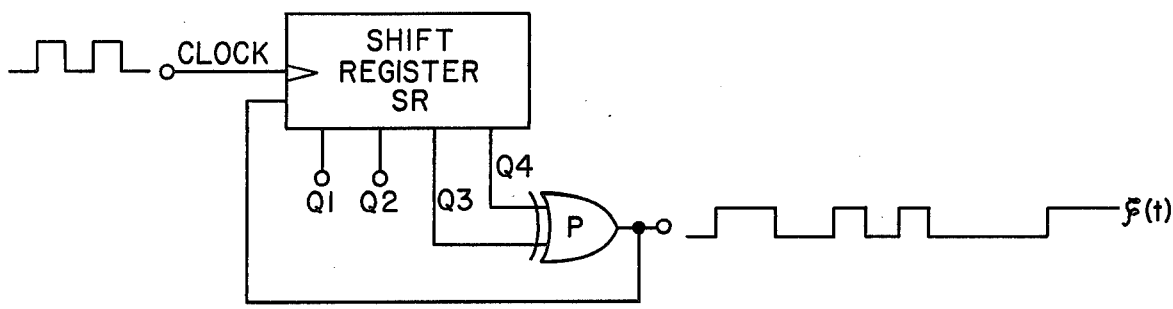
FIG. 5 shows a circuit arrangement which uses a shift register to generate a pseudo-statistical modulation function.

In each of the above examples, the modulation functions were assumed to be regular, having single positive and negative excursions of equal length defining a cycle. In order to enable the filtering out or removal of undesired interfering oscillations, the modulation functions may alternatively have negative and positive excursions occurring at irregularly, statistically determined times. A circuit for statistically altering the frequency of the switching function is illustrated in FIG. 5. A fixed clock pulse input is applied to the circuit for shifting pulses in a multi-position shift register. The Q3 and Q4 outputs of the shift register form a part of a feedback loop, and are gated to the input of the shift register by way of an Exclusive-OR gate P. The circuit of FIG. 5 thereby generates a desired pseudo-statistical switching function, which may be derived from the output of the Exclusive-OR gate P, as illustrated in FIG. 5, or, alternatively, from any of the output stages of the shift register. In the circuit of FIG. 5, it is apparent that conventional means may be provided to apply a starting pulse to the shift register.

When a system of the type shown in FIG. 5, or other statistically arranged switching devices, are employed for generating the modulation functions, the generators for generating the modulation functions for the two signals to be multiplied may be clocked at different clock rates. Alternatively, the two modulation functions may be derived from different outputs of the shift register.

In accordance with the invention, it is desirable, in order to provide a relatively error free multiplication, for the modulation frequency to be at least two times the maximum interesting frequency in the multiplication product of the two input signals. Thus, in one example, the modulation signals have frequencies of 200 Hz and 300 Hz, while the maximum interesting frequency at the output of the multiplication device will be 100 Hz. With respect to the embodiment of the invention of FIG. 3, it is preferred that the pulse repetition rate of the modulation voltage be at least 100 times the highest frequency at the output of the multiplier.

It is further apparent that the average values of the modulation functions should be substantially equal to zero.

Although the invention has been described with reference to specific example embodiments, it is to be understood, that it is to cover all modifications and equivalents within the scope of the appended claims.

What is claimed is:

1. A method for multiplying electrical signals comprising modulating each signal to be multiplied with a different modulation function, said modulation functions each having positive and negative values, multiplying said modulated signals together to form a product signal, demodulating said product signal of the modulated signals with demodulation functions which are the reciprocal of said modulation functions to produce a demodulated signal, and averaging said demodulated signal to produce an output signal.

2. The method of claim 1, wherein said step of modulating comprises modulating said electrical signals with rectangular functions having different frequencies.

3. The method of claim 1, wherein said step of modulating comprises modulating said electrical signals with phase shifted rectangular functions having the same frequency, and wherein said phase shift is $N\pi/2$ wherein N is an odd integer.

4. The method of claim 2, wherein said rectangular functions have arbitrary positive and negative values.

5. The method of claim 2, wherein said rectangular functions are switching functions having values of $\pm 1$.

6. The method of claim 1, wherein said step of demodulating comprises demodulating said product signal with the product of the reciprocal functions of the modulation functions.

7. The method of claim 1, wherein said modulation functions have a substantially greater frequency than the frequencies of said electrical signals to be multiplied.

8. The method of claim 1, wherein said step of averaging comprises applying said demodulated signal to a low pass filter.

9. The method of claim 1, further comprising statistically altering the cycle duration of said modulation and demodulation functions.

10. In a method for multiplying first and second electric signals, wherein said signals are applied to an electronic multiplier, the improvement comprising modulating at least one of said first and second signals with a function having positive and negative values before application of said one signal to said electronic multiplication device, and furhter comprising demodulating the output of said electronic multiplication device with a function that is the reciprocal of said first mentioned function, and then averaging the resulting demodulation signal.

11. In a circuit for multiplying first and second electric signals comprising a multiplier, means applying said first signal to said multiplier, and means applying said second signal to said multiplier, the improvement wherein said means applying said first electric signal to said multiplier comprises a modulator, and further comprising a demodulator connected to the output of said multiplier, means applying a modulation function to said modulator and a demodulating function that is the reciprocal of said modulating function to said demodulator, and means for filtering the output of said demodulator, whereby inherent errors of said multiplier are corrected.

12. The circuit of claim 11, wherein said means applying a modulating function to said modulator comprises means applying a modulation function having positive and negative values, to said modulator.

13. A circuit for multiplying first and second electric signals comprising first and second modulator means for modulating said first and second electric signals by different first and second modulation functions respectively, each having positive and negative values, multiplier means connected to said modulator means to receive and multiply the outputs of said first and second modulators, a demodulator connected to demodulate the output of said multiplier with a demodulating function that is the reciprocal of said first and second modulating functions, and means for averaging the output of said demodulator, whereby inherent errors of said multiplier are corrected.

14. The circuit of claim 13, wherein said demodulator means comprise first and second cascade connected demodulator means connected to sequentially demodulate the output of said multiplier means for demodulating the cycles that are the reciprocal of said first and second modulating signals, respectively.

15. The circuit of claim 13, wherein said demodulator means comprise means for demodulating the output of said multiplier means with a signal that is the reciprocal product of said first and second modulating functions.

16. The circuit of claim 13, wherein said means for modulating comprises a source of said modulating functions, said source comprising a source of a rectangular function signal having negative and positive values and a frequency substantially higher than the highest frequency of said first and second signals.

17. The circuit of claim 16, wherein said source comprises a shift register, means for shifting the contents of said shift register at a given clock rate, and feedback means selectively coupled to the outputs of said shift register for statistically altering the sequence of pulses shifted in said shift register, for producing at least one of said modulation functions.

18. The circuit of claim 11, wherein said modulator and said demodulator comprise switching means.

19. The circuit of claim 13, wherein said first and second modulator means and said demodulator comprise switching means.

* * * * *